United States Patent
Frauenglass

(10) Patent No.: US 11,644,665 B2
(45) Date of Patent: May 9, 2023

(54) LATERAL SCANNING METHOD AND APPARATUS FOR GENERATING UNIFORM LARGE AREA OPTICAL INTERFERENCE PATTERNS

(71) Applicant: Andrew Frauenglass, Albuquerque, NM (US)

(72) Inventor: Andrew Frauenglass, Albuquerque, NM (US)

(*) Notice: Subject to any disclaimer, the term of this patent is extended or adjusted under 35 U.S.C. 154(b) by 262 days.

(21) Appl. No.: 17/034,956

(22) Filed: Sep. 28, 2020

(65) Prior Publication Data

US 2022/0099962 A1   Mar. 31, 2022

(51) Int. Cl.
| | |
|---|---|
| G02B 26/00 | (2006.01) |
| G02B 26/10 | (2006.01) |
| G02B 26/12 | (2006.01) |
| G02B 27/12 | (2006.01) |

(52) U.S. Cl.
CPC .......... *G02B 26/101* (2013.01); *G02B 26/12* (2013.01); *G02B 27/123* (2013.01)

(58) Field of Classification Search
CPC ..... G02B 26/101; G02B 26/12; G02B 27/123
See application file for complete search history.

(56) References Cited

U.S. PATENT DOCUMENTS

| | | | | |
|---|---|---|---|---|
| 5,153,773 A | * | 10/1992 | Muraki | G02B 27/123 359/489.09 |
| 11,460,685 B2 | * | 10/2022 | Hillman | G02B 21/367 |
| 2009/0021801 A1 | * | 1/2009 | Ishihara | G02B 27/48 358/475 |

* cited by examiner

*Primary Examiner* — Gerald J Sufleta, II

(57) ABSTRACT

This disclosure of a scanner and method is a new way of removing non-uniformities from optical interference patterns.

2 Claims, 2 Drawing Sheets

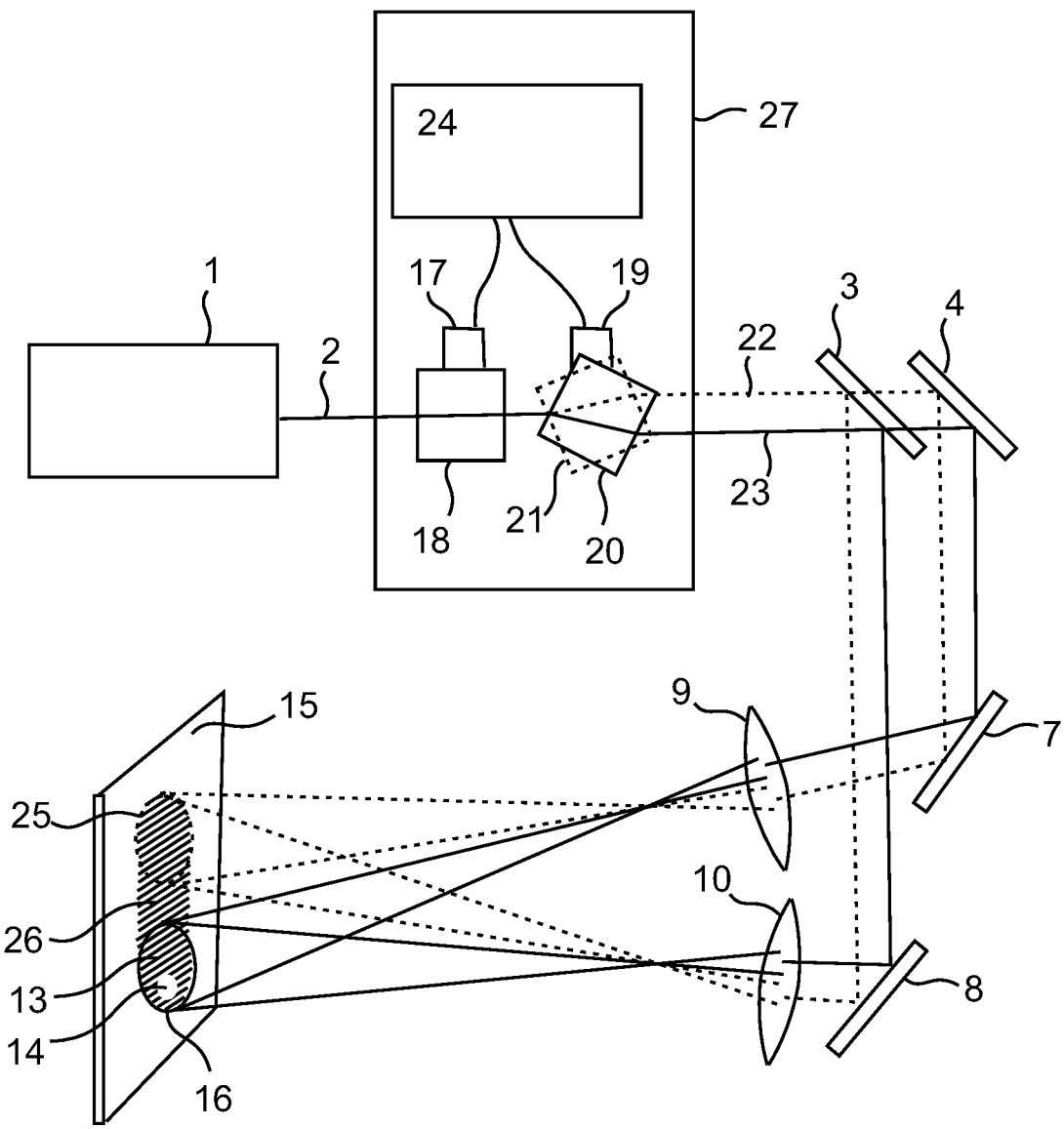

LATERAL SCANNING METHOD AND APPARATUS FOR GENERATING UNIFORM LARGE AREA OPTICAL INTERFERENCE PATTERNS

BACKGROUND OF THE INVENTION

This invention pertains to the field of interferometric lithography and specifically to a method and apparatus for generating a uniform large area optical interference pattern. One of the fundamental problems of the current state of the art optical interference pattern generation is light source profile non-uniformity. The consequence being that a non-uniform light source produces a non-uniform interference pattern. The uniform area of the interference pattern is limited to the area of the light source that is uniform. This invention addresses this fundamental problem by enabling a non-uniform light source to generate a uniform optical interference pattern over a large area.

BRIEF SUMMARY OF THE INVENTION

The present invention is a scanning method and apparatus for generating a large area uniform optical interference pattern independent of light source non-uniformity. The invention uses two refraction blocks with planar parallel surfaces to laterally translate a light beam in vertical and horizontal directions. The refraction blocks are placed in the path of the light beam before the beam splitting device of the interference pattern generating system, Laterally translating the light beam produces movement of the beam overlap area where the interference pattern is generated. Continuous scanning movement of the overlap area overlaps non-uniform areas of the interference pattern with uniform interference pattern and increases the size of the continuous uniform interference pattern area.

BRIEF DESCRIPTION OF THE SEVERAL VIEWS OF THE DRAWING

FIG. 2 is a schematic of a lateral scanner added to the optical interference pattern generating system of FIG. 1. The laterally translated beam paths, the non-uniform interference pattern area start and stop positions, an increased in the area of uniform optical interference pattern, a beam splitting device, folding mirror, alignment mirrors, expansion lenses, pattern recording area, and light source are shown.

DETAILED DESCRIPTION OF THE INVENTION

Figure 1:
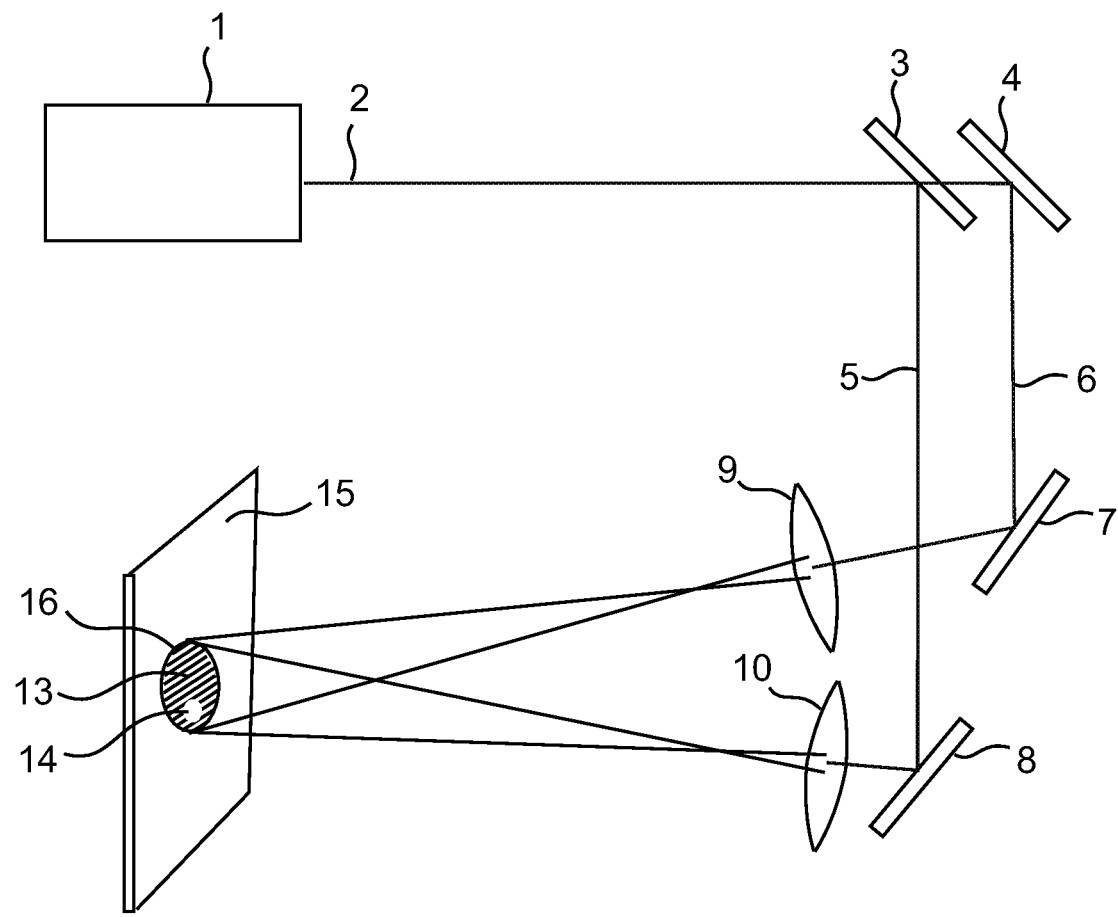
FIG. 1 is a schematic of a common interference pattern generating system showing a light source, light beam path, beam splitting device, steering mirror, alignment mirrors, expansion lenses, and a non-uniform interference pattern.

In the following description and accompanying drawings the working properties and details of the invention are set forth in order to provide one skilled in the art to utilize the working properties of the invention without these details. The details of the invention are used as examples and are not intended to limit the scope of the invention.

FIG. 1 is a schematic of a common optical interference pattern generation system. A non-uniform light beam 2 produced by light source 1 encounters beam splitting device 3 then splitting into first split beam 5 and second split beam 6. First split beam 5 reflects from first alignment mirror 8 and then passes through first expansion lens 10. Second split beam 6 reflects from steering mirror 4 to alignment mirror 7 then through expansion lens 9. First split beam 5 and second split beam 6 recombine in beam overlap area 16 generating optical interference pattern 13 including non-uniform area 14. The non-uniform optical interference pattern is recorded on optical interference pattern recording area 15.

FIG. 2 is a schematic of the same common optical interference pattern generator of FIG. 1 with the addition of lateral scanner 27 inserted between light source1 and before beam splitting device 3. The lateral scanner components include galvanometer driver 24, horizontal galvanometer 17, horizontal lateral refraction block 18, vertical galvanometer 19, and vertical refraction block 20. Non-uniform light beam 2 is translated laterally from beam path 22 to beam path 23 by rotating vertical refraction block 20 from its start position 21 to its current position using vertical galvanometer 19 controlled by galvanometer controller 24. Rotating refraction bock 20 causes beam overlap area 16 to scan from its start position 25 continuously across optical interference pattern recording area 15 to its current position, Non-uniform area 14 is covered over uniformly by optical interference pattern 13 producing continuous uniform large area optical interference pattern 26. Horizontal galvanometer 17 and horizontal refraction block 18 move beam overlap area 16 horizontally and together with vertical galvanometer 19 and vertical refraction block 20 moving beam overlap area vertically controller 24 can scan beam overlap area 16 continuously over optical interference pattern recording area 15 to produce continuous uniform large area optical interference patterns.

Thus it will be appreciated by those skilled in the art that the present invention is not restricted to the preferred embodiments described with reference to the drawings and that variations may be made therein without departing from the scope of the present invention as defined by the appended claims and equivalents thereof.

What is claimed is:

1. A lateral scanner comprising: a vertical refraction block with parallel planar surfaces attached to a vertical galvanometer, a horizontal refraction block with parallel planar surfaces attached to a horizontal galvanometer, a galvanometer controller, a means where a light beam of an optical interference pattern generation system is scanned laterally before the light beam is split into two beams.

2. A method where a light beam is translated laterally from a first beam path to a second beam path comprising: providing a vertical refraction block with parallel planar surfaces attached to a vertical galvanometer; providing a horizontal refraction block with parallel planar surfaces attached to a horizontal galvanometer; translating a light beam laterally from the first beam path to the second beam path by rotating the vertical refraction block from a first position to a second position, wherein the second position creates a non-orthogonal surface with respect to the light beam thereby refracting the light beam and changing its optical path; wherein only after exiting the vertical refraction block is the light beam split into two beams.

* * * * *